United States Patent [19]

Kirtley et al.

[11] Patent Number: 5,635,836
[45] Date of Patent: Jun. 3, 1997

[54] MECHANICAL APPARATUS WITH ROD, PIVOT, AND TRANSLATION MEANS FOR POSITIONING A SAMPLE FOR USE WITH A SCANNING MICROSCOPE

[75] Inventors: John R. Kirtley, Katonah, N.Y.; Sarah H. Blanton, Reston, Va.; Mark B. Ketchen, Hadley, Mass.

[73] Assignee: International Business Machines Corporation, Armonk, N.Y.

[21] Appl. No.: 327,242

[22] Filed: Oct. 21, 1994

[51] Int. Cl.⁶ .............................. G01R 33/00; G21K 5/10
[52] U.S. Cl. .......................... 324/262; 324/228; 324/248; 250/442.11
[58] Field of Search .................................. 324/228, 262, 324/248; 250/306, 423 F, 310, 311, 491.1, 492.2, 492.3, 442.11; 310/331

[56] References Cited

U.S. PATENT DOCUMENTS

| | | | |
|---|---|---|---|
| 3,778,621 | 12/1973 | Mikajiri | 250/442.11 |
| 3,835,338 | 9/1974 | Martin | 310/331 |
| 3,896,314 | 7/1975 | Nukui et al. | 250/442.11 |
| 4,874,945 | 10/1989 | Ohi | 250/306 |
| 4,931,732 | 6/1990 | Moon | 324/262 |
| 5,148,026 | 9/1992 | Watanabe et al. | 250/306 |
| 5,266,897 | 11/1993 | Watanuki et al. | 324/244 |
| 5,354,985 | 10/1994 | Quate | 250/234 |
| 5,367,165 | 11/1994 | Toda et al. | 250/306 |
| 5,428,206 | 6/1995 | Yokoyama et al. | 250/442.11 |
| 5,479,024 | 12/1995 | Hillner et al. | 250/458.1 |

FOREIGN PATENT DOCUMENTS

| | | | |
|---|---|---|---|
| 0301505 | 2/1989 | European Pat. Off. | 250/442.11 |
| 402158044 | 6/1990 | Japan | 250/442.11 |
| 403262912 | 11/1991 | Japan | 324/262 |

OTHER PUBLICATIONS

S.E. Nave and P.G. Hurey, "Micromagnetic Susceptometer", *Rev. Sci. Instrum.*, vol. 51 No. 5, at pp. 591–596 (May 1980).

L. Vu. et al., "Design and Implementation of a Scanning Squid Microscope", *IEEE Transactions on Applied Superconductivity*, vol. 3, No. 1, Mar. 1993.

A.M. Chang et al., "Scanning Hall Probe Microscopy", *Applied Physics Letters*, vol. 61, at p. 1974 (1992).

R.C. Black et al., "Magnetic microscopy using a liquid nitrogen cooled $YBa_2Cu_3O_7$ superconducting quantum interference device", *Applied Physics Letters*, vol. 62, at p. 2128 (1993).

H. Minami et al., "Detection of Trapped Flux Quanta in Superconducting Films by Scanning a SQUID Pick-up Coil", *Cryogenics*, vol. 32, at p. 648 (1992).

A. Mathai et al., "One-dimensional Magnetic Flux Miccroscope Based on the DC Superconducting Quantum Interference Device", *Applied Physics Letters*, vol. 61, at p. 598 (1992).

I.M. Thomas et al., "Spatial Resolution and Sensitivity of Magnetic Susceptibility Imaging", *IEEE Transactions on Applied Superconductivity*.

(List continued on next page.)

*Primary Examiner*—Sandra L. O'Shea
*Assistant Examiner*—Jay M. Patidar
*Attorney, Agent, or Firm*—Ratner & Prestia

[57] ABSTRACT

A positioning apparatus for performing coarse and fine positioning of samples for scanning such as by a scanning microscope system generally and a scanning SQUID microscope especially. The apparatus includes a connecting rod that pivots about a fixed point and a translation mechanism, such as an XYZ translation device, for manipulating one end of the rod to cause motion at the other end by way of the fixed pivot point. At the other end of the rod, a sample may be mounted such that the manipulating mechanism can move the rod in a plurality of directions so the sample can be scanned by a sensing device.

18 Claims, 5 Drawing Sheets

OTHER PUBLICATIONS

D.W. Abraham et al., "Noise Reduction Technique for Scanning Tunneling Microscopy", *Applied Physics Letters*, vol. 53, at p. 1503 (1988).

F.P. Rogers, BS/MS Thesis, "Early flux magnetometer", *MIT* (1983).

S. Bermon et al., "Minature SQUID Magnetometer", *IBM Technical Disclosure Bulletin*, vol. 27, at p. 5847 (1985).

Benediktov et al., Universal manipulator for a low-voltage electron–diffraction camera, Instuments and experimental Tech, vol. 19, No. 3, pp. 847–848 (250/442.11) May 1997.

John Clarke, "SQUIDS", Scientific American, Aug. 1994, pp. 46–53.

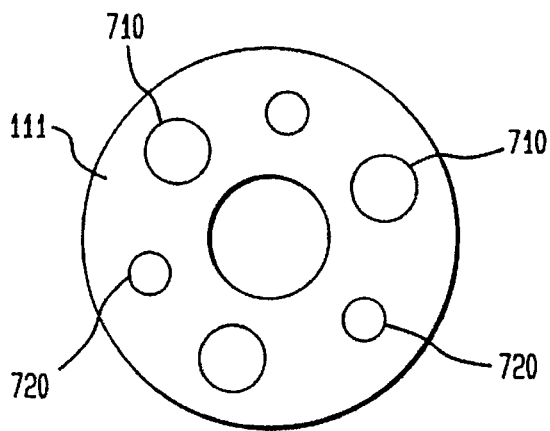
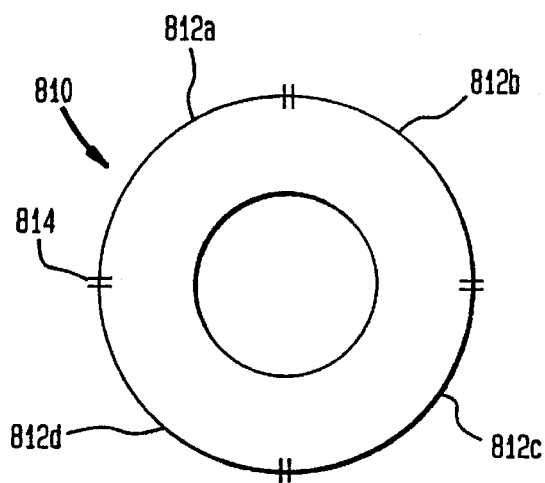
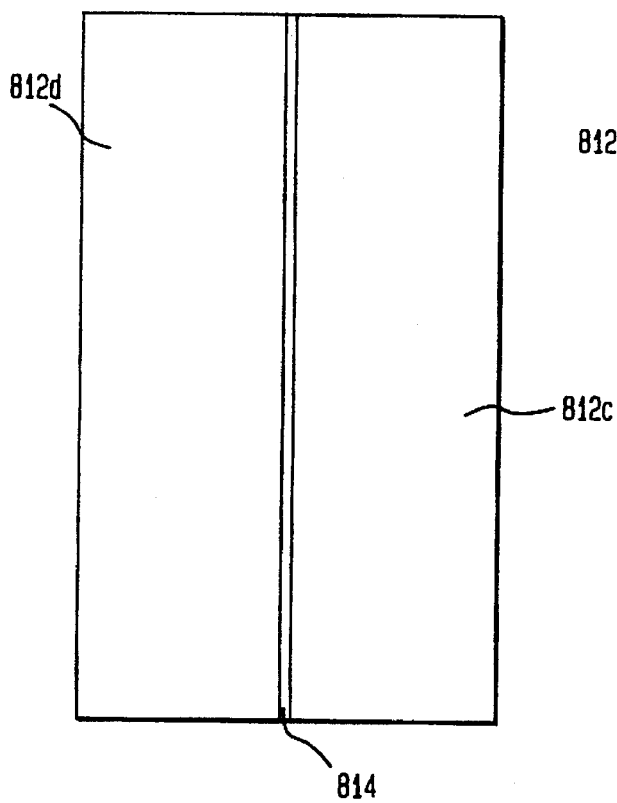

MECHANICAL APPARATUS WITH ROD, PIVOT, AND TRANSLATION MEANS FOR POSITIONING A SAMPLE FOR USE WITH A SCANNING MICROSCOPE

FIELD OF THE INVENTION present invention relates generally to a positioning apparatus and, more particularly, it relates to a sample positioning apparatus using pivoting and translating techniques especially useful for a scanning superconducting quantum interference device (SQUID) microscope.

BACKGROUND OF THE INVENTION

It is well known that sample imaging can be performed using local magnetic fields. The state of the art in imaging using local magnetic fields, however, still experiences several drawbacks. Some imaging apparatus suffer from relatively poor field sensitivity such as the scanning Hall probe microscope. While others, such as existing scanning SQUID microscopes, have relatively poor spatial resolution. Superconducting quantum interference devices (SQUIDs) are more fully explained, for example, in the article by John Clarke in the August 1994 issue of Scientific American which is herein incorporated by reference.

In addition to the above drawbacks, existing scanning Hall probe microscopes have limited scan ranges and existing SQUID microscopes are very complex mechanically.

Furthermore, among existing scanning devices, piezoelectric scanners have the disadvantage that they have limited scan range, especially at low temperatures. Conventional piezoelectric inchworms have reasonable resolution over large scan ranges, but require large, rapidly changing voltages to drive them, and do not work at extreme sample temperatures. And, in remote mechanical scanning, long mechanical connections are required between the drive mechanism and the sample mount as in, for example, cryogenic applications. Such long mechanical connections tend to limit the mechanical stiffness that can be designed into the system, making it more sensitive to vibrations.

In the field of scanning microscopes, U.S. Pat. No. 4,874,945 is directed to a structure that combines a scanning or transmission electron microscope with a tunneling microscope. The '945 Patent employs a mechanism for coarse positioning of the piezo scanner. The coarse positioning mechanism is designed to be firmly locked in position while scanning takes place using the piezo mechanism. The '945 mechanism has several drawbacks including its complexity and its lack of flexibility for performing large field-of-view scanning.

SUMMARY OF THE INVENTION

The present invention involves a sample positioning apparatus especially useful with scanning microscopes including a connecting rod having first and second ends, the second end being adapted to carry a sample. The apparatus further includes a translation device coupled proximate to the first end of the rod for manipulating one end of the rod and a pivot member for pivoting the rod between the first and second ends. Manipulation of the first end by the translation device moves the sample carried at the second end such that the sample may be scanned by the scanning microscope or other device.

BRIEF DESCRIPTION OF THE DRAWINGS

The aspects, features and advantages of the present invention will be more readily understood from the following detailed description when read in conjunction with the accompanying drawings, in which:

FIG. 7 shows a top view of an exemplary sample mount shown in FIGS. 1 and 2.

FIGS. 8a and 8b show a top and side view, respectively, of the tube scanner shown in FIG. 1.

DETAILED DESCRIPTION

The present invention involves a positioning apparatus which has particular application with scanning microscopes. The present invention, due to its design, overcomes many of the prior art drawbacks including mechanical complexity and limited scan ranges by using a pivoting rod apparatus. The present invention is designed to be of simple construction for performing large field-of-view scanning with relatively low susceptibility to external vibrations.

Figure 1:
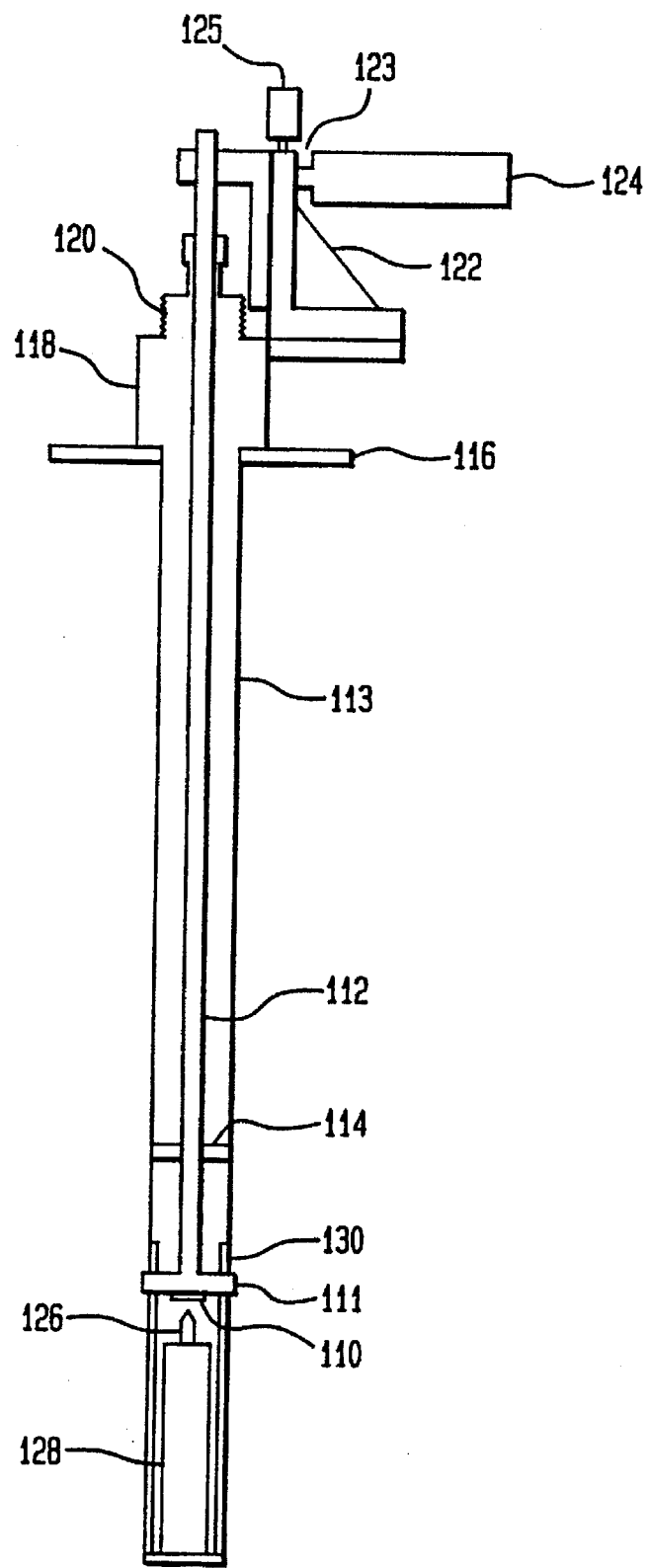
FIG. 1 shows an exemplary embodiment of a scanning SQUID microscope employing the present invention.

FIG. 1 shows an exemplary construction of the positioning apparatus of the invention in conjunction with a scanning SQUID microscope system.

A sample 110 is mounted on sample mount or holder 111 which is attached to one end of connecting rod 112. In the present invention, rod 112 is a stiff stainless steel tube. Rod 112 is designed such that it can provide thermal insulation for either cryogenic or high temperature applications.

Figure 2:
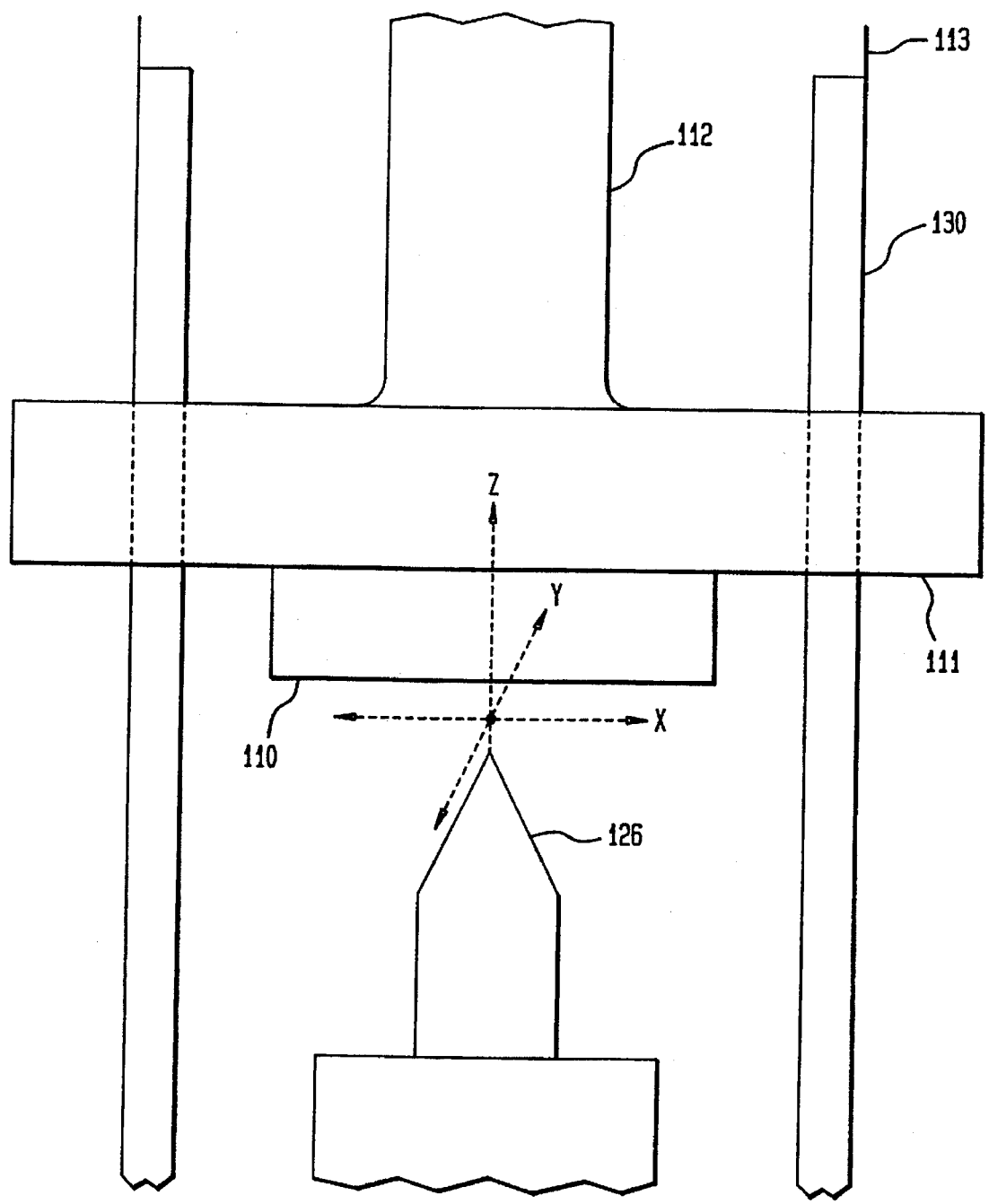
FIG. 2 shows a close-up view of the sample mount area of the apparatus shown in FIG. 1.

Rod 112 extends through a long tube 113 and passes through a pivot ring 114. Pivot ring 114 functions to allow rod 112 to move with three-degrees of freedom (i.e., in the x, y, and z planes) as shown in FIG. 2. Rod 112 pivots with two degrees of freedom (i.e., x and y planes) around pivot means 114 which is proximate to sample 110. Rod 112 also slides with a third degree of freedom (z axis) to vary the spacing between sample 110 and SQUID loop 126.

Figure 4:
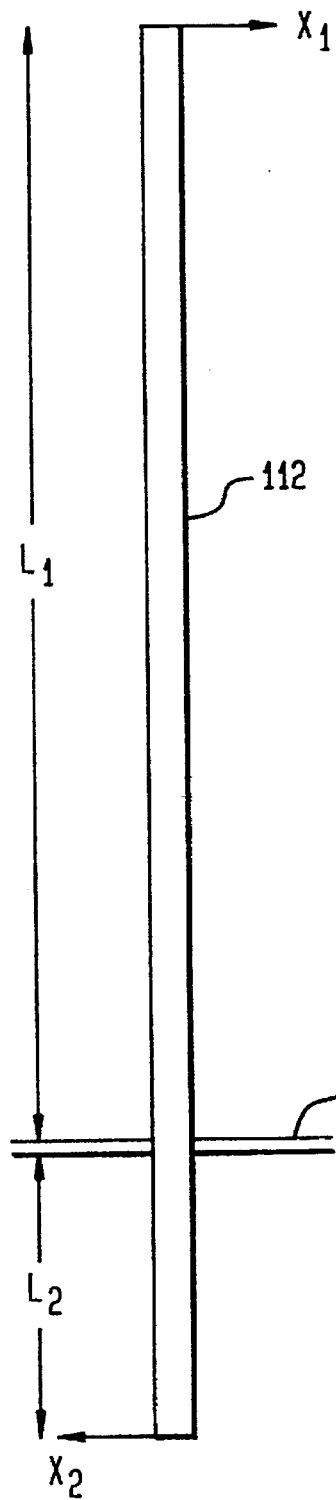
FIG. 4 shows the rod of FIG. 1 including the pivot means.

Having pivot means 114 close to the sample has two effects: 1) it reduces the scan distance by the ratio of the lengths of the two lever arms (the sections of rod 112 on either side of the pivot ring 114, L1 and L2 of FIG. 4, enabling improved spatial resolution; and 2) it reduces susceptibility to external vibrations by making a relatively stiff assembly. In the present invention the total length of rod 112 is about 100 cm, with pivot ring 114 about 10 cm from sample mount 111.

Figure 6A:
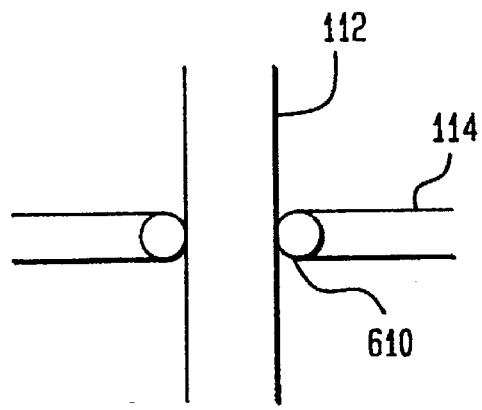
FIGS. 6a and 6b show a side view and top view, respectively, of an alternate embodiment for the pivot means shown in FIGS. 1,3 and 4.
Figure 6B:
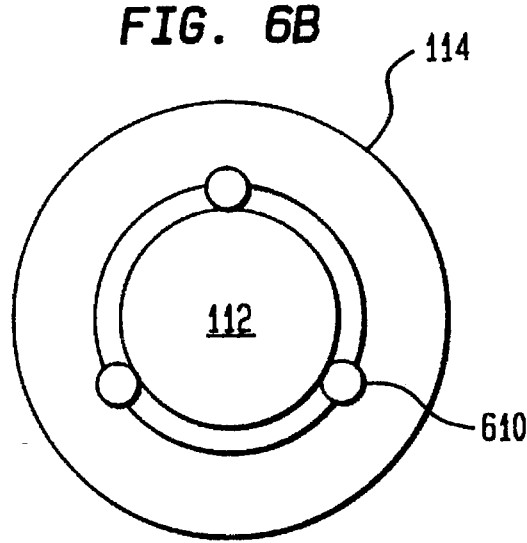

In the present invention, the pivot ring 114 is a simple washer, and rod 112 pivots on a few high points either on the washer or on rod 112. More sophisticated pivot means designs are contemplated, for example, an alternate pivot means design may involve a race of ball bearings 610, such as shown in FIGS. 6a and 6b. In non-cryogenic applications, the stainless steel washer could be replaced by a flexible pivot ring made of, for example, viton rubber.

Figure 3:
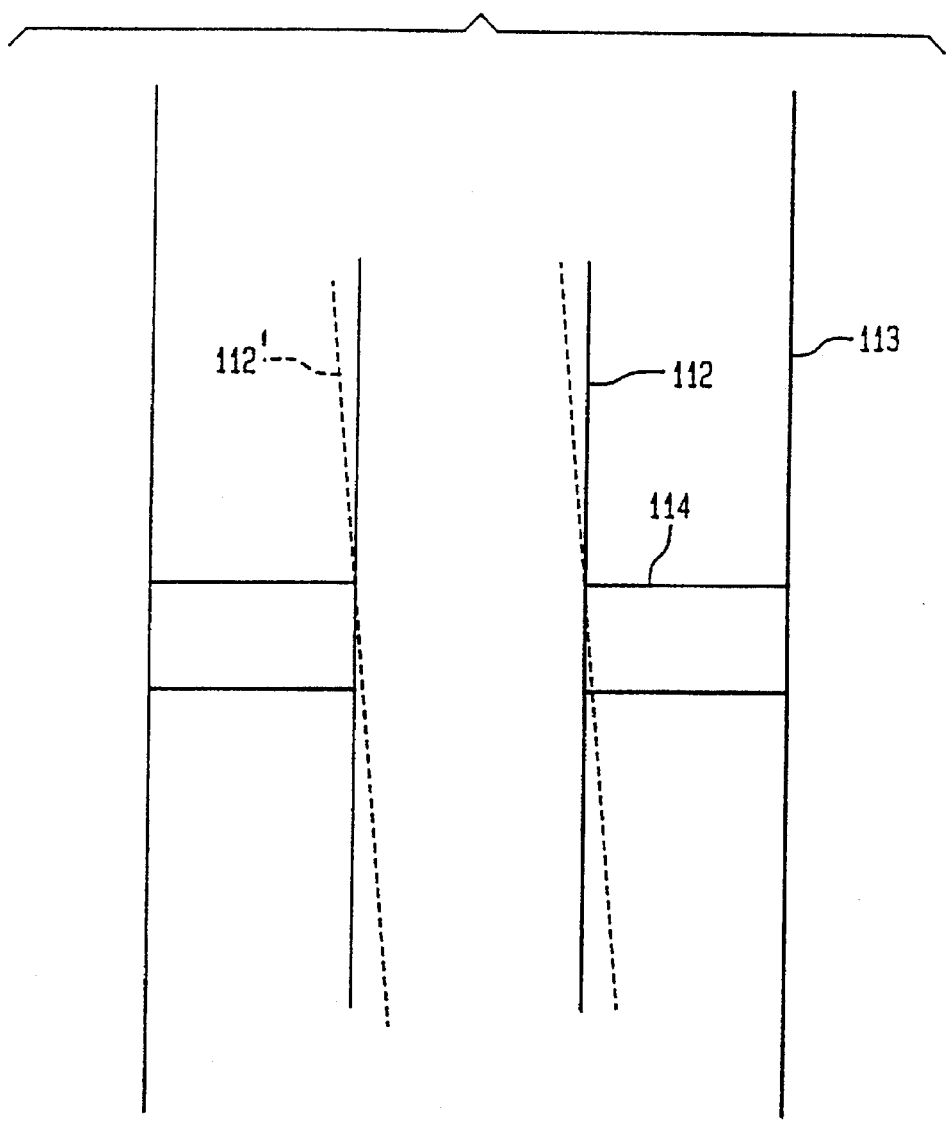
FIG. 3 shows a close-up view of the pivot ring area of the apparatus shown in FIG. 1.

Rod 112 fits sufficiently within pivot means 114 to, as mentioned above, minimize, or possibly prevent, substantial movement or vibration in the horizontal (x-y) plane. Pivot means 114 allows rod 112 to slide vertically, and tilt for purposes of scanning the sample 110 in the horizontal plane as represented by dotted lines 112 but constrains rod 112 from vibrating in the horizontal plane, as shown in the close up view of FIG. 3.

At the lower end of rod 112 is sample mount 111. A sample 110, such as a silicon wafer with thin film electronic devices on the surface, is attached to sample mount 111 for purposes of being scanned by a sensing device, here SQUID loop 126, which is attached to sensing device holder 128. It should be noted that, as shown in FIG. 7, sample mount 111 is provided with through holes 710 through which narrow rods 130 are positioned. The thickness of narrow rods 130 is designed such that they do not obstruct or reduce the spatial resolution of the overall pivoting assembly. Additional holes 720 may be provided for purposes such as securing samples, taking temperature, etc.

In addition to the mechanical pivot scanning arrangement, holder 128 can be a piezo-tube scanner 810 to provide fine scale scanning motion. The piezo-tube has the advantage of precise and relatively hysteresis-free motion, with the disadvantage of limited scan range. Whereas, the mechanical pivot scanner has a much larger scanning range, but is not as precise for small motions. The combination of these two scanning mechanisms in a scanning SQUID microscope allows a large range of field sizes to be employed.

In addition, the piezo-tube scanner allows the position of the SQUID loop 126 to be modulated sinusoidally in time by a voltage applied to the piezo tube. Refer to FIGS. 8a and 8b for respective top and side views of a typical piezo tube scanner. As is well understood in the art, and as is shown in FIGS. 8a and 8b, piezo tube scanner 810 outer surface is electrically sectioned into 4 sections 812a–d including scribe marks 814 for providing electrical isolation between electrodes. A voltage applied across two opposing faces of the tube has the effect of bending it in either of two orthogonal directions in the horizontal plane. Voltage applied between the inside and outside of the tube lengthens or shortens it. Thus, a signal from the SQUID loop 126 can be phase sensitively detected at the modulation frequency, reducing the low frequency (1/f) noise, an important source of noise for the highest sensitivity measurements.

The upper end of rod 112 passes through mounting flange 116, through vacuum seal 118 with flexible bellows 120. Bellows 120 may be provided to create a vacuum tight seal between sample 110 and the scanning mechanism, for example XYZ translation stage 122 and linear actuators 124.

The upper end of rod 112 is attached to translation means 123 for providing motion along the x, y, and z axes. In the present invention, bellows 120 is a commercial bellows manufactured by Huntington Laboratories and translation means 123 is a commercial translation device manufactured by Newport Inc. including an XYZ translation stage 122 and linear actuators 124.

Translation stage 122 is driven in the horizontal plane by two linear actuators (only one actuator is shown in FIG. 1 as reference numeral 124, the other linear actuator is oriented perpendicular to and behind actuator 124). The vertical (or Z axis) positioning of rod 112 is adjusted with a differential micrometer 125. The positioning apparatus of the present invention can be designed to have many desired scan ranges, and is not affected by the sample space temperature.

It should be noted that translation means 123 including the translation stage 122 and linear actuators 124 is thermally insulated from the pivot means 114 such that, for example, the translation means 123 is at ambient pressure and temperature while the sample 110 is surrounded by liquid helium in the SQUID microscope.

Referring to FIG. 4, the horizontal displacement of sample mount 111, x2, is smaller than the horizontal displacement of translation means 123, x1 by the ratio L1/L2, which in the present embodiment is equal to 100−10/10= 90/10=factor of 9. In the present invention, the total scan range is limited by binding of rod 112 with the inside of bellows 120 to about 500 microns. If the pivoting of rod 112 relative to pivot means 114 were ideal, the precision of the scanning of the sample mount 111 would be better than the precision of translation means 123 by the ratio L1/L2. In the present invention, XYZ translation stage 122 has a precision of about 1 micron, implying that the precision of the sample scanning should be about 0.1 microns. In experiments, however, hysteresis has been observed in sample scanning of a few tens of microns, but no measurable distortion of the images on the scale of a few microns within the useful scan range of about 500 microns.

Figure 5:
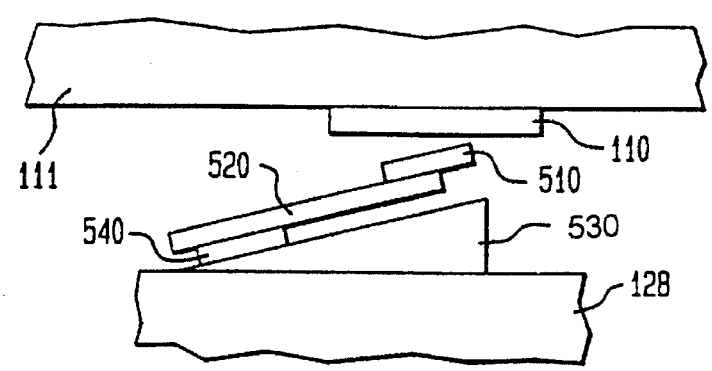
FIG. 5 shows a means for compensating for variations in height between sample and sensor.

In practice, the transverse motion of the sample mount does not necessarily keep the sample at constant spacing relative to the sensor, such as SQUID loop 126. There are several reasons for this. First, even if the pivot point were ideal, the sample would move in an arc relative to the sensor. Second, the pivot point is not ideal, causing variations in the height during scanning. Third, it is very difficult to align the plane of the sample with the scan plane of the sensor. To compensate for this non-planar behavior, the cantilever positioning means of FIG. 5 is provided. In the particular embodiment of the invention shown in FIG. 5, SQUID 510 is mounted on flexible cantilever 520 (here a piece of brass shim stock). Cantilever 520 is spaced apart from wedge 530 by spacer 540 (here a microscope cover glass slide). SQUID 510 is run with the tip of the SQUID substrate in direct contact with sample 110. Cantilever 520 bends to compensate for variations in sample height while scanning so that SQUID pickup loop 126 is always at constant spacing from the sample surface.

Some tradeoffs to be considered when selecting rod lengths are as follows:

1) longer rod lengths provide better thermal isolation between scanning mechanism 123 and sample holder 111, but more susceptibility to external vibrations;

2) a large lever ratio L1/L2 gives better scanning resolution and better isolation from external vibrations, but smaller total scan range.

The present invention could be modified to give a total scan range of a few centimeters, while still retaining acceptable vibration isolation for scanning SQUID applications. Shrinking the design for application to scanning capacitance, atomic force microscopy, and scanning tunneling microscopy may be feasible, however, those of ordinary skill in the art would appreciate that avoiding the introduction of unacceptable vibrations is important.

In operation, SQUID loop 126 and tube scanner 128 are held fixed while the sample 110 is moved by way of the pivot means 114 and translation means 123 (i.e., adjustments made to the linear actuators 124 and vertical micrometer) to accomplish scanning, especially with large field-of-view, with the local magnetic fields.

Although this invention was described by way of application to the scanning SQUID microscope, it can be used in any application where at least two-dimensional scanning of a sensor relative to a sample is required. Some potential applications include the scanning tunneling microscope, scanning atomic force microscope, scanning near-field optical microscope, and scanning capacitance microscope. Thus, the present invention is not intended to be limited to the details shown. Rather, it will be appreciated that various modifications may be made in the details within the scope and range of equivalents of the claims and without departing from the spirit of the invention.

What is claimed:

1. An apparatus for positioning a sample comprising:

a rod having first and second ends, said second end carrying the sample;

translation means coupled proximate to said first end of said rod for moving said second end of said rod;

means, separate from said rod and said translation means, for pivoting said rod between said first and second ends, wherein manipulation of said first end of said rod by said translation means moves said rod about said pivot means which thereby moves the sample carried at said second end of said rod in an arc-like motion, the sample being scanned during said arc-like sample movement; and a stationary sensing device, located proximate to the sample, for sensing the sample during said arc-like sample movement caused by said translation means and said pivot means.

2. The sample positioning apparatus of claim 1, wherein said translation means moves said rod with three degrees of freedom along x, y, and z axes and includes at least one linear actuator and a differential micrometer.

3. The sample positioning apparatus of claim 2, wherein said translation means controls rod in all three degrees of freedom.

4. The sample positioning apparatus of claim 1, wherein the sensing device is stationary and said translation means moves said rod with three degrees of freedom in x, y, and z axes and includes at least one linear actuator and a differential micrometer.

5. The sample positioning apparatus of claim 1, wherein said pivot means minimizes movement and vibration of said rod in a horizontal plane.

6. The sample positioning apparatus of claim 1, wherein said pivot means divides said rod into an upper portion (L1) and a lower portion (L2) such that a spatial resolution for movement of the sample is a function of (L1) divided by (L2), wherein said translation means moves said rod along the z axis with respect to said pivot means thereby changing the ratio of (L1) to (L2).

7. The sample positioning apparatus of claim 6, wherein (L1) divided by (L2) is in the range of 5 to 15.

8. The sample positioning apparatus of claim 7, wherein (L1) divided by (L2) is approximately 9.

9. The sample positioning apparatus of claim 7, wherein (L1) divided by (L2) is approximately 10.

10. The sample positioning apparatus of claim 1, further including a vacuum seal thermally insulating said translation means from the sample.

11. The sample positioning apparatus of claim 1, wherein said pivot means is a washer.

12. The sample positioning apparatus of claim 1, wherein said pivot means includes a plurality of ball bearings.

13. The sample positioning apparatus of claim 1 wherein said sensing device is a SQUID.

14. The sample positioning apparatus of claim 1 wherein said second end includes a sample holder and wherein said sensing device is attached to a piezo electric device.

15. The sample positioning apparatus of claim 14 wherein said sensing device is attached to a flexible cantilever and said cantilever is attached to said piezo electric device.

16. The sample positioning apparatus of claim 1 wherein said sensing device is attached to cantilever positioning means.

17. An apparatus for positioning a sample comprising:

a rod having first and second ends, said second end carrying the sample;

translation means coupled proximate to said first end of said rod for moving said second end of said rod;

means, separate from said rod and said translation means, for pivoting said rod between said first and second ends, wherein manipulation of said first end of said rod by said translation means moves said rod about said pivot means which thereby moves the sample carried at the second end of said rod in an arc-like motion, the sample being scanned during said arc-like sample movement;

a stationary sensing device, located proximate to the sample, for sensing the sample during said arc-like sample movement caused by said translation means and said pivot means; and cantilever positioning means for maintaining contact between the sample and said sensing device during sensing and said arc-like sample movement.

18. The sample positioning apparatus of claim 17, wherein said cantilever positioning means is a flexible cantilever, wherein said sensing device is securely attached to the flexible cantilever and said cantilever is connected with a piezoelectric device.

* * * * *

UNITED STATES PATENT AND TRADEMARK OFFICE
CERTIFICATE OF CORRECTION

PATENT NO. : 5,635,836
DATED : June 3, 1997
INVENTOR(S) : Kirtley et al.

It is certified that error appears in the above-identified patent and that said Letters Patent is hereby corrected as shown below:

On the cover page, item [56] References Cited, U.S. Patent Documents, delete "5,428,206 6/1995 Yokoyama et al." and insert therefor --5,438,206 8/1995 Yokoyama et al.--.

Column 2, line 45, delete "means" and insert therefor --ring--.

Column 2, line 48, delete "means" and insert therefor --ring--.

Column 3, line 3, delete "as represented by dotted lines 112" and insert therefor --(as represented by dotted lines 112')--.

Column 4, lines 49-50, after "acceptable" delete the period ".".

Signed and Sealed this

Twenty-fifth Day of November, 1997

Attest:

BRUCE LEHMAN

*Attesting Officer*  *Commissioner of Patents and Trademarks*